(12) United States Patent
Yanase et al.

(10) Patent No.: US 8,916,881 B2
(45) Date of Patent: Dec. 23, 2014

(54) SEMICONDUCTOR DEVICE AND METHOD FOR MANUFACTURING SEMICONDUCTOR DEVICE

(71) Applicant: Kabushiki Kaisha Toshiba, Tokyo (JP)

(72) Inventors: Naoko Yanase, Tokyo (JP); Shingo Masuko, Kanagawa (JP); Takaaki Yasumoto, Kanagawa (JP); Ryoichi Ohara, Tokyo (JP); Yorito Kakiuchi, Kanagawa (JP); Takao Noda, Kanagawa (JP); Kenya Sano, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/023,177

(22) Filed: Sep. 10, 2013

(65) Prior Publication Data

US 2014/0014971 A1  Jan. 16, 2014

Related U.S. Application Data

(62) Division of application No. 13/021,400, filed on Feb. 4, 2011, now Pat. No. 8,558,244.

(30) Foreign Application Priority Data

Feb. 10, 2010 (JP) .................................. 2010-027121

(51) Int. Cl.
*H01L 29/15* (2006.01)
*H01L 31/0312* (2006.01)
(Continued)

(52) U.S. Cl.
CPC ............ *H01L 29/04* (2013.01); *H01L 29/1608* (2013.01); *H01L 29/0619* (2013.01); *H01L 29/8611* (2013.01); *H01L 29/45* (2013.01); *H01L 29/7802* (2013.01); *H01L 29/66068* (2013.01); *H01L 21/0485* (2013.01); *H01L 29/402* (2013.01); *H01L 21/046* (2013.01)
USPC ........................................................ 257/77

(58) Field of Classification Search
USPC ........... 257/77, 76, 328, 329, 7, 93, 334, 427, 257/444, 262, 368–401, E29.255–E29.313, 257/E29.315–E29.316; 438/105, 212, 268, 438/931
See application file for complete search history.

(56) References Cited

U.S. PATENT DOCUMENTS 6,573,534 B1  6/2003  Kumar et al.
2002/0145145 A1  10/2002  Nakashima et al.
(Continued)

FOREIGN PATENT DOCUMENTS

JP  2000-101099 A  4/2000
JP  3361061 B2  1/2003
(Continued)

OTHER PUBLICATIONS

Japanese Office Action mailed Mar. 27, 2013, filed in Japanese counterpart Application No. 2010-027121, 6 pages (with translation).
(Continued)

*Primary Examiner* — Dao H Nguyen
*Assistant Examiner* — Tram H Nguyen
(74) *Attorney, Agent, or Firm* — Patterson & Sheridan, LLP (57) ABSTRACT

According to one embodiment, a semiconductor device includes a SiC layer of a first conductivity type, a SiC region of a second conductivity type, and a conductive layer of the second conductivity type. The SiC layer of the first conductivity type has a hexagonal crystal structure. The SiC region of the second conductivity type is formed in a surface of the SiC layer. The conductive layer of the second conductivity type is provided on the SiC region and is in contact with a portion of the SiC region including SiC of a cubic crystal structure.

7 Claims, 9 Drawing Sheets

(51) Int. Cl.
*H01L 29/16* (2006.01)
*H01L 29/06* (2006.01)
*H01L 29/861* (2006.01)
*H01L 29/45* (2006.01)
*H01L 29/78* (2006.01)
*H01L 29/04* (2006.01)
*H01L 29/66* (2006.01)
*H01L 21/04* (2006.01)
*H01L 29/40* (2006.01)

(56) References Cited

U.S. PATENT DOCUMENTS

| | | | |
|---|---|---|---|
| 2005/0230686 A1* | 10/2005 | Kojima et al. | 257/77 |
| 2006/0237728 A1* | 10/2006 | Ryu | 257/77 |
| 2007/0235745 A1 | 10/2007 | Hayashi et al. | |
| 2008/0079009 A1 | 4/2008 | Yaegashi | |
| 2008/0203399 A1* | 8/2008 | Spencer et al. | 257/77 |
| 2009/0159898 A1* | 6/2009 | Fujiwara et al. | 257/77 |

FOREIGN PATENT DOCUMENTS

| | | |
|---|---|---|
| JP | 2004-111760 | 4/2004 |
| JP | 2004-221462 | 8/2004 |
| JP | 2006-179662 | 7/2006 |
| JP | 2007-103564 | 4/2007 |
| JP | 2007-305964 | 11/2007 |
| JP | 2008-306034 | 12/2008 |
| JP | 2009-049198 | 3/2009 |

OTHER PUBLICATIONS

Japanese Office Action mailed Sep. 3, 2013, filed in Japanese counterpart Application No. 2010-027121, 5 pages (with translation).
Japanese Office Action dated Dec. 16, 2013, filed in Japanese counterpart Application No. 2013-227384, 8 pages (with translation).

* cited by examiner

SEMICONDUCTOR DEVICE AND METHOD FOR MANUFACTURING SEMICONDUCTOR DEVICE

CROSS-REFERENCE TO RELATED APPLICATIONS

This application is a divisional of U.S. patent application Ser. No. 13/021,400, filed on Feb. 4, 2011, which is based upon and claims the benefit of priority from the prior Japanese Patent Application No. 2010-027121, filed on Feb. 10, 2010; the entire contents of which are incorporated herein by reference.

FIELD

Embodiments described herein relate generally to a semiconductor device and a method for manufacturing the semiconductor device.

BACKGROUND

Power semiconductor devices used for power control are required to have low power loss during operation. Specifically, it is important to reduce the on-resistance in switching control. This requires a technique for reducing the internal resistance resulting from the device structure and the contact resistance between the metal electrode and the semiconductor.

Silicon carbide (SiC) is a wide gap semiconductor having a wide forbidden gap and hence is more resistant to high electric field than silicon. This enables reduction of the internal resistance. Thus, SiC is promising as a material for realizing a power semiconductor device with lower power loss. However, because SiC is a wide gap semiconductor, it is difficult to reduce the contact resistance between SiC and the metal electrode. Techniques for solving this problem are currently under study.

BRIEF DESCRIPTION OF THE DRAWINGS

FIGS. 2A to 3B are schematic views showing a manufacturing process of the semiconductor device according to the first embodiment;

FIGS. 5A to 8C are schematic views showing a manufacturing process of the semiconductor device according to the second embodiment;

DETAILED DESCRIPTION

In general, according to one embodiment, a semiconductor device includes a SiC layer of a first conductivity type, a SiC region of a second conductivity type, and a conductive layer of the second conductivity type. The SiC layer of the first conductivity type has a hexagonal crystal structure. The SiC region of the second conductivity type is formed in a surface of the SiC layer. The conductive layer of the second conductivity type is provided on the SiC region and is in contact with a portion of the SiC region including SiC of a cubic crystal structure.

Embodiments will now be described with reference to the drawings. In the following embodiments, like components in the drawings are labeled with like reference numerals, with the detailed description thereof omitted as appropriate, and the different components are described as appropriate. Furthermore, unless otherwise specified, in the following description, it is assumed that the first conductivity type is N-type and the second conductivity type is P-type.

(First Embodiment)

Figure 1:
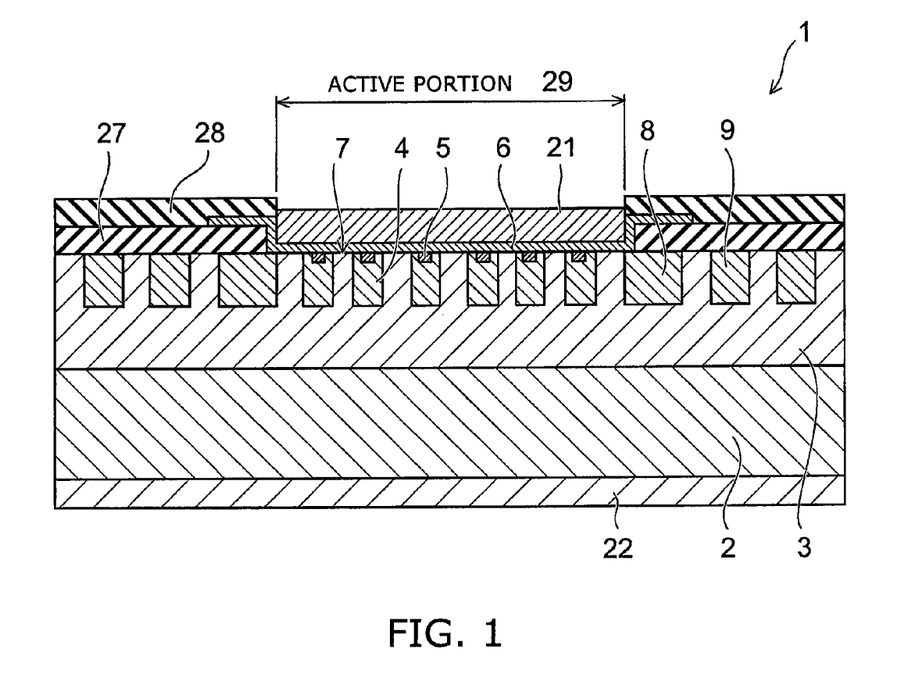
FIG. 1 is a schematic view showing a cross section of a semiconductor device according to a first embodiment.

FIG. 1 is a schematic view showing a cross section of a semiconductor device according to a first embodiment. In the description of this embodiment, a diode 1 for power control formed in an N-type SiC layer is taken as an example.

As shown in FIG. 1, the diode 1 according to this embodiment includes an N-type SiC layer 3 formed on the first major surface of an N-type SiC substrate 2. The N-type SiC layer 3 has a hexagonal crystal structure. For instance, a single crystal called 4H—SiC can be used for the N-type SiC layer 3. Here, the first major surface refers to the upper major surface of the N-type SiC substrate 2 and the N-type SiC layer 3 shown in FIG. 1. This also applies to the subsequent figures.

SiC is a semiconductor which can have a cubic or hexagonal crystal structure. Depending on the difference in a crystal structure, SiC is classified into three types, i.e., 3C—SiC, 6H—SiC, and 4H—SiC. 3C—SiC is SiC of a cubic crystal structure, whereas 6H—SiC and 4H—SiC are both SiC of a hexagonal crystal structure. 6H—SiC and 4H—SiC have a wider forbidden gap than 3C—SiC, and are considered suitable as a material for power devices.

In the active portion 29 shown at the center of the cross-sectional structure in FIG. 1, a P-type SiC region 4 and a P-type conductive layer 6 doped with P-type impurity are provided in the first major surface, i.e., the surface of the N-type SiC layer 3. The P-type conductive layer 6 can be e.g. a polysilicon layer doped with P-type impurity. The P-type conductive layer 6 includes a portion in contact with the surface of the P-type SiC region 4 and an operating region 7 in which the P-type conductive layer 6 is in contact with the N-type SiC layer 3 to form a PN junction.

Furthermore, a recrystallized region 5 is provided in the portion of the P-type SiC region 4 in contact with the P-type conductive layer 6. The recrystallized region 5 includes 3C—SiC and reduces the contact resistance between the P-type conductive layer 6 and the P-type SiC region 4.

More specifically, the forbidden gap of 3C—SiC is approximately 2.23 eV, which is narrower than that of 6H—SiC, approximately 2.93 eV and that of 4H—SiC, approximately 3.26 eV, both hexagonal crystals. Hence, as compared with the case where the P-type SiC region 4 of hexagonal crystal is brought into direct contact with the P-type conductive layer 6, the contact resistance can be reduced by bringing them into contact via 3C—SiC.

On the other hand, around the active portion 29, a guard ring region 8 is provided in contact with both ends of the P-type conductive layer 6. Furthermore, outside the guard ring region 8, a P-region 9 is formed in contact with a passivation film 27. The guard ring region 8 and the P-region 9 increase the breakdown voltage in the peripheral portion of the operating region 7. This can prevent edge breakdown in the peripheral portion.

In the diode 1 according to this embodiment, in the off-mode in which the operating region 7 is reverse biased, the PN junction between the P-type SiC region 4 and the N-type SiC layer 3 is also reverse biased, and a depletion layer extends in the N-type SiC layer 3. This can increase the reverse breakdown voltage of the diode 1.

On the other hand, in the on-mode in which the operating region 7 is forward biased, an on-current flows between the anode electrode 21 and the cathode electrode 22. Here, the on-current flows through the operating region 7 including the PN junction between the P-type conductive layer 6 and the N-type SiC layer 3, the PN junction having a lower built-in voltage than the PN junction between the P-type SiC region 4 and the N-type SiC layer 3.

Furthermore, if the diode 1 during on-mode operation is applied with a surge voltage, a current flows also in the PN junction between the P-type SiC region 4 and the N-type SiC layer 3 in addition to the operating region 7. Here, the recrystallized region 5 can be provided between the P-type SiC region 4 and the P-type conductive layer 6 to reduce the contact resistance. Then, the excessive current flowing in the operating region 7 can be smoothly shunted through the PN junction between the P-type SiC region 4 and the N-type SiC layer 3. This can increase the surge breakdown voltage in the on-mode of the diode 1.

Next, a process for manufacturing the diode 1 according to this embodiment is described with reference to FIGS. 2A to 3B. Here, FIGS. 2A to 3B are schematic views showing the right half of the cross-sectional structure of the diode 1 shown in FIG. 1.

Figure 2A:
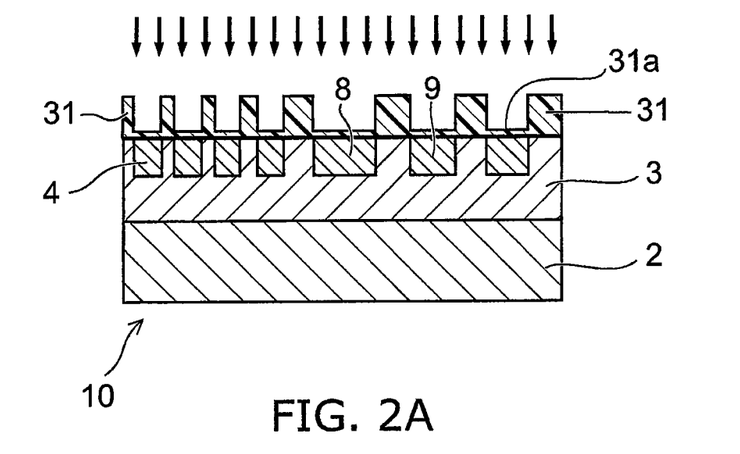

FIG. 2A is a partial cross-sectional view of a SiC wafer 10. FIG. 2A schematically shows the process for forming a P-type SiC region 4, a guard ring region 8, and a P-region 9 by ion implantation of P-type impurity into the first major surface of the N-type SiC layer 3. In the SiC wafer 10, an N-type SiC layer 3 with low impurity concentration is epitaxially grown on an N-type 4H—SiC substrate 2 doped with high impurity concentration. The N-type SiC layer 3 is also made of 4H—SiC and has a hexagonal crystal structure.

First, on the first major surface of the N-type SiC layer 3, for instance, a thermal oxide film having a thickness of approximately 40 nm is formed by the dry oxidation method. Subsequently, a silicon dioxide film 31 ($SiO_2$ film) having a thickness of 2 μm is formed by the thermal CVD method. Furthermore, an ion implantation pattern is formed in the $SiO_2$ film 31 by photolithography. Here, the $SiO_2$ film can be removed by RIE (reactive ion etching) with a thin film 31a left in a portion where P-type impurity is to be implanted. This can prevent, for instance, damage to the surface of the N-type SiC layer 3 due to the RIE plasma and contamination in the subsequent process.

Next, the $SiO_2$ film 31 is used as an implantation mask to ion-implant aluminum (Al) as P-type impurity into the region where a P-type SiC region 4, a guard ring region 8, and a P-region 9 are to be formed. Here, to reduce implantation damage, the SiC wafer 10 can be heated to 500° C. during the ion implantation.

Despite the heat treatment of the SiC wafer 10 performed after the ion implantation, Al implanted into the N-type SiC layer 3 remains at the implanted position without redistribution. Hence, in order to form a desired distribution of P-type impurity in the first major surface of the N-type SiC layer 3, for instance, multistage ion implantation may be performed with the dose amount and implantation energy varied as shown in TABLE 1.

TABLE 1

|  | DOSE AMOUNT ($\times 10^{13}$ cm$^{-2}$) | IMPLANTATION ENERGY (keV) |
|---|---|---|
| FIRST ION IMPLANTATION | 0.725 | 40 |
| SECOND ION IMPLANTATION | 2.42 | 100 |
| THIRD ION IMPLANTATION | 2.42 | 200 |
| FOURTH ION IMPLANTATION | 2.42 | 300 |
| FIFTH ION IMPLANTATION | 4.03 | 350 |

Next, the $SiO_2$ film 31 is removed by wet etching with BHF (buffered hydrogen fluoride). Subsequently, activation annealing is performed in an Ar atmosphere at 1900° C. for 5 minutes.

Subsequently, a thermal oxide film is formed approximately 40 nm on the first major surface of the N-type SiC layer 3 by the dry oxidation method. Furthermore, for instance, a $SiO_2$ film is deposited by the LP-CVD (Low Pressure Chemical Vapor Deposition) method to form a passivation film 27 of approximately 1 μm.

Figure 2B:
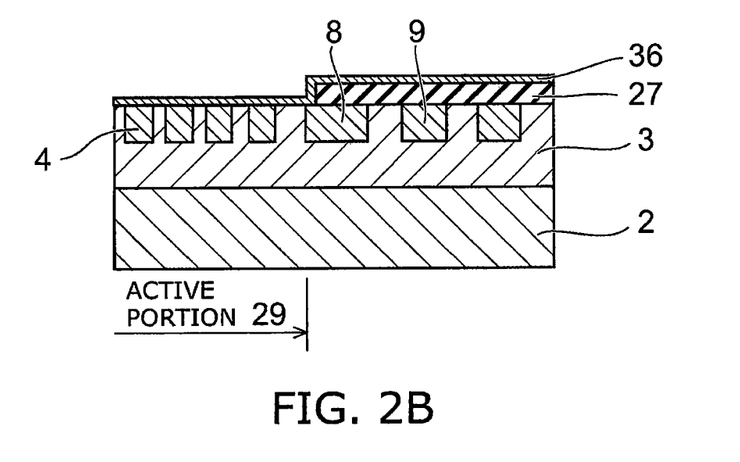

Next, as shown in FIG. 2B, the passivation film 27 in the active portion 29 is removed by wet etching. Subsequently, for instance, a polysilicon layer 36 is deposited by the LP-CVD method. Thus, a polysilicon layer 36 constituting a P-type conductive layer 6 can be formed on the N-type SiC layer 3 and the P-type SiC region 4 provided on the first major surface of the N-type SiC layer 3.

Figure 2C:
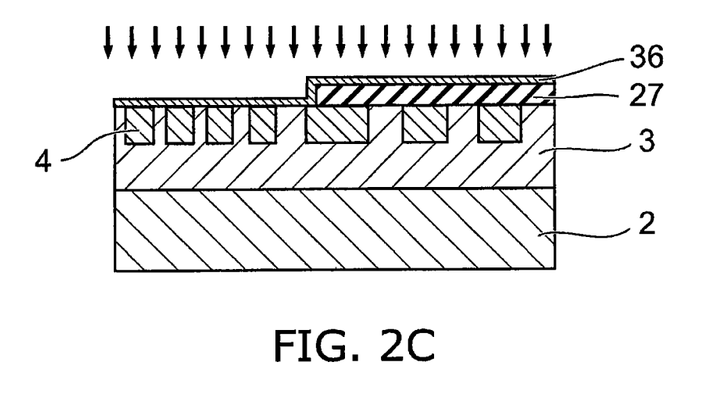

Furthermore, as shown in FIG. 2C, P-type impurity is ion-implanted into the polysilicon layer 36. For instance, boron (B) can be used as the P-type impurity. As the implantation condition, the dose amount can be set to $5 \times 10^{14}$ cm$^{-2}$, and the implantation energy can be set to 20 keV.

Alternatively, the polysilicon layer 36 can also be formed as a conductive polysilicon layer, which is doped with P-type impurity during deposition. In this case, the ion implantation of P-type impurity shown in FIG. 2C can be omitted.

Figure 3A:
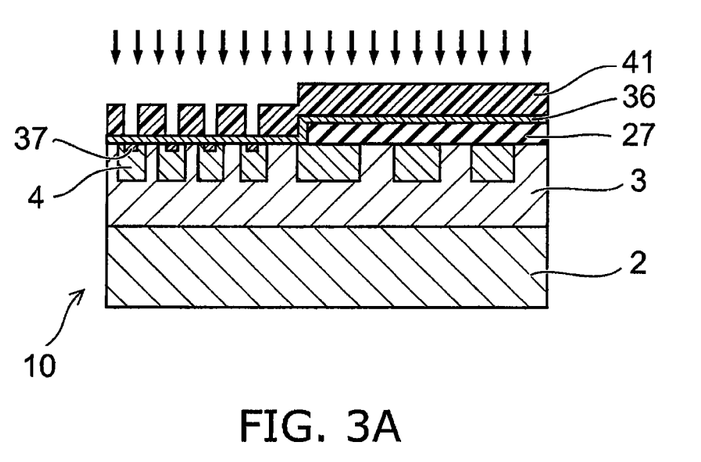

Next, as shown in FIG. 3A, P-type impurity is ion-implanted into the P-type SiC region 4 and the polysilicon layer 36. Thus, the polysilicon layer 36 is doped with P-type impurity, and implantation damage is formed in the portion of the P-type SiC region 4 in contact with the polysilicon layer 36.

First, an implantation mask 41 for selective implantation of P-type impurity is formed. The implantation mask can be made of e.g. a photoresist film. As shown in FIG. 3A, an opening is provided in the photoresist film 41 above the P-type SiC region 4 by photolithography.

Next, B can be selected as P-type impurity and ion-implanted under the condition of, e.g., a dose amount of $3 \times 10^{15}$ cm$^{-2}$ and an implantation energy of 300 keV. While the ion implantation is performed, the SiC wafer is maintained at room temperature to form a damage region 37 in the surface portion of the P-type SiC region 4, so that the crystal can be turned amorphous, for instance. The implantation energy can be set in consideration of the thickness of the polysilicon layer 36 so that the damage region 37 is formed in the surface layer of the P-type SiC region 4.

Figure 3B:
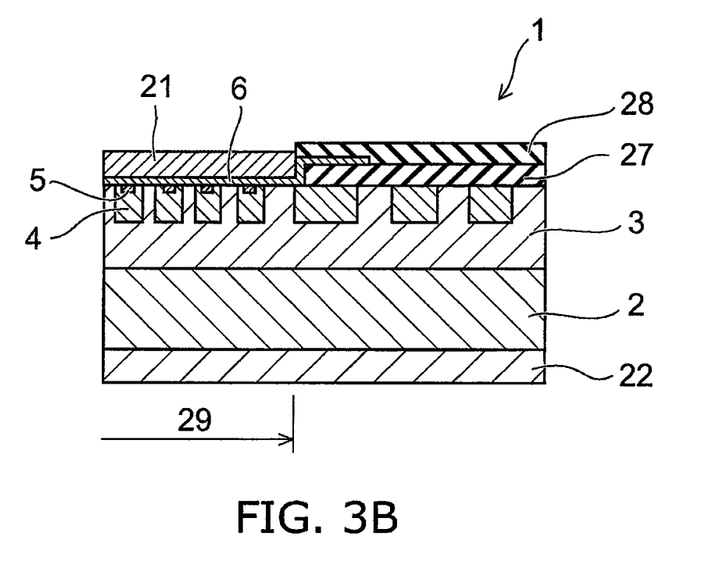

Next, as shown in FIG. 3B, the polysilicon layer 36 is selectively removed by dry etching and left only in the active portion 29 and its outer peripheral portion.

Subsequently, the P-type SiC region 4 and the polysilicon layer 36 are heat treated. Thus, the P-type impurity implanted into the polysilicon layer 36 is activated, and the amorphous layer of the damage region 37 formed in the surface portion of the P-type SiC region 4 is recrystallized to form a recrystallized region 5 including 3C—SiC.

For instance, by heat treatment of the SiC wafer 10 in a forming gas atmosphere (a mixture of hydrogen and nitrogen) at 900° C. for 10 minutes, the P-type SiC region 4 and the polysilicon layer 36 can be heat treated. Thus, B as P-type impurity in the polysilicon layer 36 is activated to form a P-type conductive layer 6. Furthermore, a low resistance contact is formed between the P-type conductive layer 6 and the recrystallized region 5 including 3C—SiC, which is formed between the P-type SiC region 4 and the P-type conductive layer 6.

Next, an anode electrode 21 is formed on the surface of the P-type conductive layer 6. The anode electrode 21 can be made of e.g. metal aluminum. As shown in FIG. 3B, after forming the anode electrode 21 made of metal aluminum on the P-type conductive layer 6, annealing is performed in a forming gas atmosphere at 450° C. for 10 minutes. Thus, ohmic contact can be formed between the P-type conductive layer 6 and the anode electrode 21.

On the surface outside the active portion 29, a surface protective film 28 is formed from a photosensitive polyimide film. Furthermore, a cathode electrode 22 is formed on the second major surface of the N-type SiC substrate 2. Thus, the diode 1 is completed.

In the method for manufacturing the diode 1 according to this embodiment, after forming a polysilicon layer 36 in contact with the P-type SiC region 4 of the 4H—SiC structure, P-type impurity is ion-implanted to form a damage region 37. Then, by simply performing heat treatment, a low resistance contact can be formed between the P-type conductive layer 6 and the P-type SiC region 4.

The heat treatment for recrystallizing the damage region 37 to form 3C—SiC can be performed at a temperature of 1000° C. or less. Thus, without degrading the PN junction formed at the interface of the P-type conductive layer 6 and the N-type SiC layer 3, a low resistance contact can be formed between the P-type conductive layer 6 and the P-type SiC region 4. Furthermore, no degradation is caused at the interface of the passivation film 27 and the N-type SiC layer 3 outside the active portion 29. Hence, there is no decrease of breakdown voltage and no increase of leakage current in the peripheral portion.

That is, the method for manufacturing a semiconductor device according to this embodiment can be easily performed and is suitable to manufacture the diode 1, for instance.

In the description of this embodiment, the P-type conductive layer is made of polysilicon as an example, but is not limited thereto. For instance, a single crystal silicon layer or a compound semiconductor such as GaAs can also be used. This also applies to the embodiments described below.

(Second Embodiment)

Figure 4:
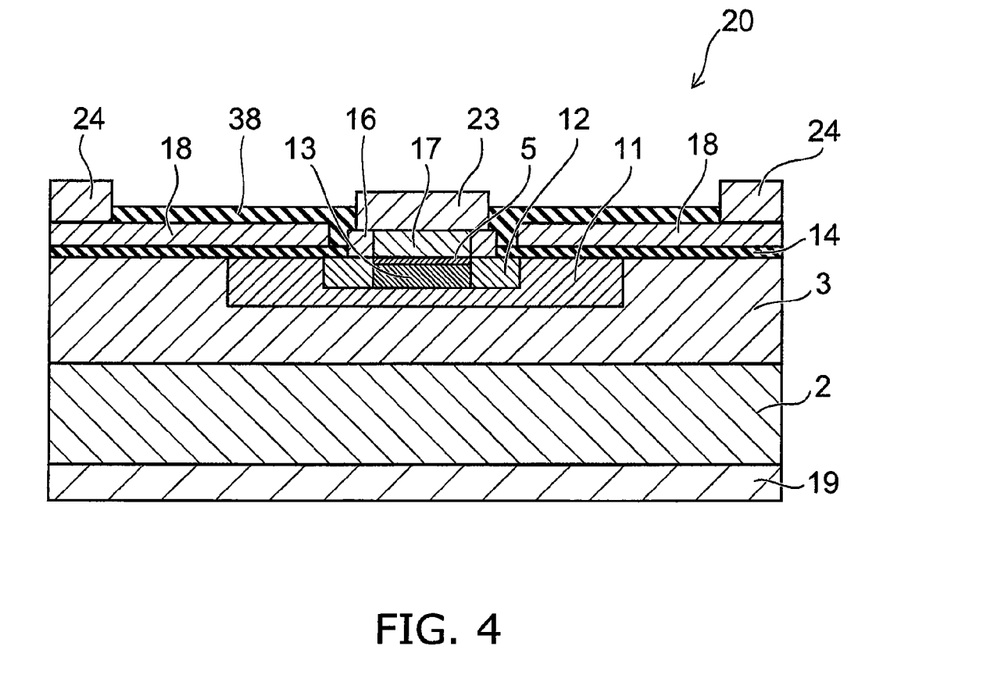
FIG. 4 is a schematic view showing a cross section of a semiconductor device according to a second embodiment.

FIG. 4 is a schematic view showing a cross section of a semiconductor device according to a second embodiment. In the description of this embodiment, a power MOSFET 20 formed in an N-type SiC layer 3 is taken as an example. FIG. 4 schematically shows a cross section of a unit cell of the power MOSFET 20.

As shown in FIG. 4, the power MOSFET 20 includes a P-type base region 11 as a first semiconductor region, an N-type source region 12 as a second semiconductor region, and a P-type contact region 13 as a third semiconductor region. The P-type base region 11 is provided in the first major surface, i.e., the surface of the N-type SiC layer 3 having a hexagonal crystal structure. The N-type source region 12 is selectively provided in the surface of the P-type base region 11. The P-type contact region 13 is selectively provided in the surface of the P-type base region 11 adjacent to the N-type source region 12.

Furthermore, as shown in FIG. 4, a gate electrode 18 is provided above the P-type base region 11 via a gate oxide film 14. A gate wiring 24 is connected to the surface of the gate electrode 18.

An N-type conductive layer 16 as a first conductive layer and a P-type conductive layer 17 as a second conductive layer are provided on the N-type source region 12 and the P-type contact region 13, respectively. A recrystallized region 5 including 3C—SiC is formed in the portion of the P-type contact region 13 in contact with the P-type conductive layer 17.

Furthermore, a source wiring 23 is provided on the N-type conductive layer 16 and the P-type conductive layer 17. A drain electrode 19 is provided on the second major surface of the N-type SiC substrate 2.

The power MOSFET 20 according to this embodiment is configured so that the N-type conductive layer 16 and the P-type conductive layer 17 are in contact with the N-type source region 12 and the P-type contact region 13, respectively, to reduce the contact resistance. Furthermore, the recrystallized region 5 including 3C—SiC is formed in the surface of the P-type contact region 13 to reduce the P-type contact resistance.

The N-type conductive layer 16 and the P-type conductive layer 17 can be made of materials such as polysilicon, single crystal silicon, and compound semiconductor, which do not react with each other at the heat treatment temperature in forming the recrystallized region 5.

Alternatively, the N-type conductive layer 16 and the P-type conductive layer 17 can also be made of metal materials, such as nickel (Ni), suitable for N-type SiC and P-type SiC, respectively. However, in the case of using metal materials, the metal materials need to be spaced from each other to avoid reaction therebetween. In contrast, as described above, in the case of using materials such as polysilicon which do not react with each other, the N-type conductive layer 16 and the P-type conductive layer 17 can be provided in contact with each other. This is advantageous to reduce electrode spaces for miniaturization.

FIGS. 5A to 8C are partial cross-sectional views of a SiC wafer 50 showing a process for manufacturing the power MOSFET 20 according to this embodiment. Here, FIGS. 5A to 8C each show the right half of the cross-sectional structure of the power MOSFET 20 shown in FIG. 4.

Figure 5A:
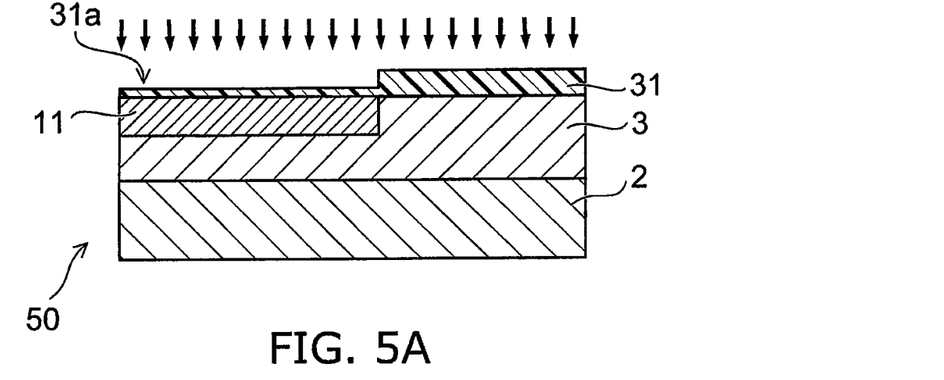

FIG. 5A is a cross-sectional view schematically showing a process for forming a P-type base region 11 by ion implantation of P-type impurity into the first major surface of the N-type SiC layer 3. The N-type SiC layer 3 is made of e.g. 4H—SiC and has a hexagonal crystal structure.

First, on the first major surface of the N-type SiC layer 3, for instance, a SiO$_2$ film 31 having a thickness of 2 μm is used to form an implantation mask. Here, a thin film 31a is left in a portion where P-type impurity is to be ion-implanted.

Next, aluminum (Al) as P-type impurity is ion-implanted into the region where a P-type base region 11 is to be formed. Here, the SiC wafer 50 can be heated to 500° C. Furthermore, multistage ion implantation may be performed under the implantation condition shown in TABLE 1.

Figure 5B:
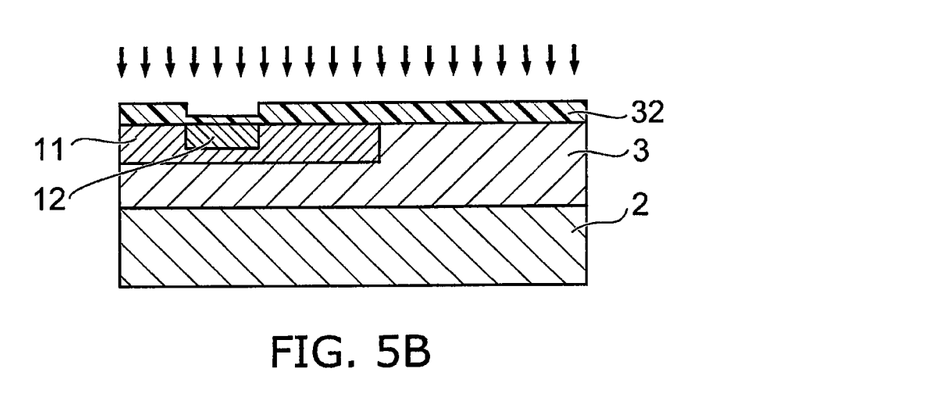

Next, the SiO$_2$ film 31 is removed by wet etching with BHF. Then, as an implantation mask, a SiO$_2$ film 32 having a thickness of 1 μm is again formed. Subsequently, as shown in FIG. 5B, an opening is formed in a portion of the SiO$_2$ film 32 where an N-type source region 12 is to be formed. Then, the SiO$_2$ film 32 is used as an implantation mask to ion-implant N-type impurity. For instance, phosphorus (P) can be used as the N-type impurity. The ion implantation may be multistage implantation performed under the implantation condition shown in TABLE 2. This implantation can be performed as high temperature implantation with the SiC wafer 50 heated to 500° C.

TABLE 2

| | DOSE AMOUNT ($\times 10^{14}$ cm$^{-2}$) | IMPLANTATION ENERGY (keV) |
|---|---|---|
| FIRST ION IMPLANTATION | 5.0 | 40 |
| SECOND ION IMPLANTATION | 5.0 | 70 |
| THIRD ION IMPLANTATION | 10.0 | 100 |
| FOURTH ION IMPLANTATION | 10.0 | 150 |
| FIFTH ION IMPLANTATION | 20.0 | 200 |
| SIXTH ION IMPLANTATION | 20.0 | 250 |

Next, the SiO$_2$ film 32 is removed. Then, as an implantation mask, a SiO$_2$ film 33 having a thickness of 1 μm is again formed. Subsequently, in a portion of the SiO$_2$ film where a P-type contact region 13 is to be formed, the SiO$_2$ film is etched to form an opening. Thus, an implantation mask is formed.

Figure 5C:
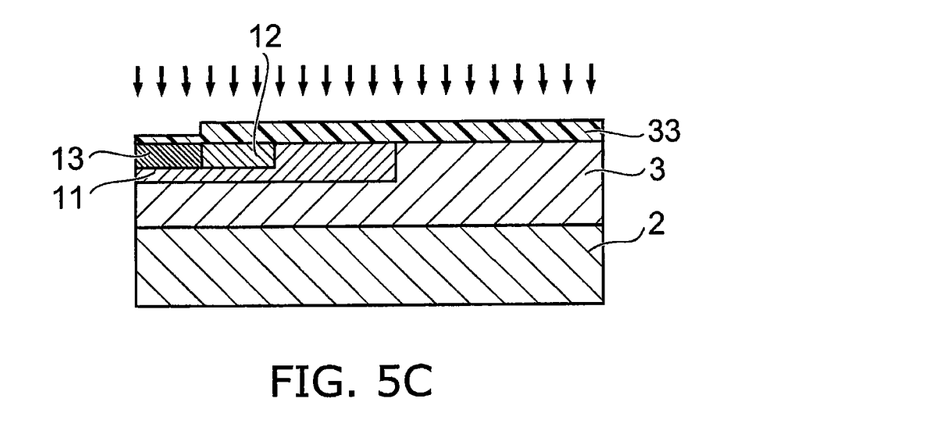

As shown in FIG. 5C, the SiO$_2$ film 33 is used as an implantation mask to ion-implant Al as P-type impurity, for instance. The ion implantation may be multistage implantation performed under the implantation condition shown in TABLE 2. The implantation can be performed as high temperature implantation with the SiC wafer 50 heated to 500° C.

As described above, after ion implantation for the P-type base region 11, the N-type source region 12, and the P-type contact region 13, activation annealing is performed in an Ar atmosphere at 1900° C. for 5 minutes.

Figure 6A:
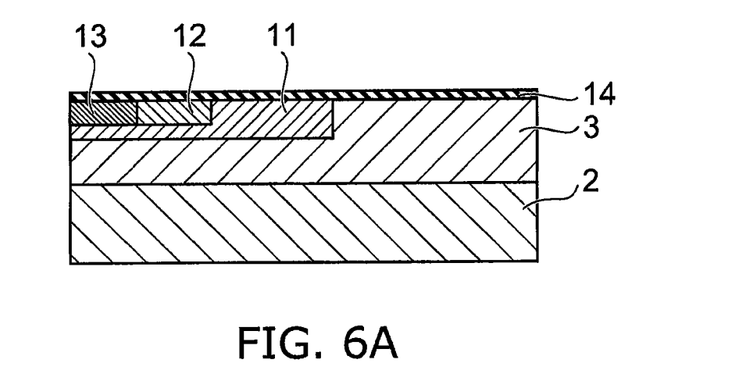

Next, as shown in FIG. 6A, the first major surface of the N-type SiC layer 3 is dry oxidized to form a gate oxide film 14.

Figure 6B:
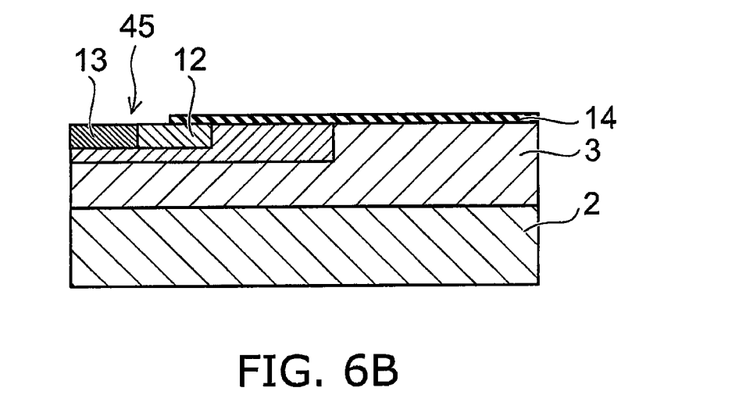

Subsequently, as shown in FIG. 6B, the gate oxide film 14 formed on the surface of the N-type source region 12 and the P-type contact region 13 is partly etched away to form a contact window 45.

Figure 6C:
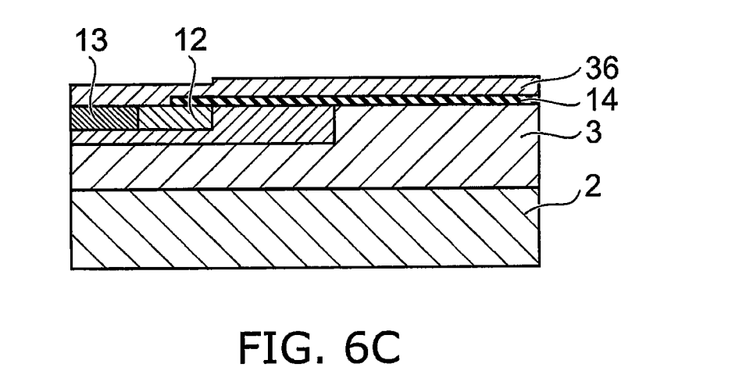

Furthermore, as shown in FIG. 6C, on the first major surface of the N-type SiC layer 3, for instance, a polysilicon layer 36 having a thickness of approximately 0.3 μm is formed. The polysilicon layer 36 can be deposited by the LP-CVD method.

The polysilicon layer 36 can be a conductive polysilicon layer, which is doped with N-type impurity or P-type impurity during deposition.

Figure 7A:
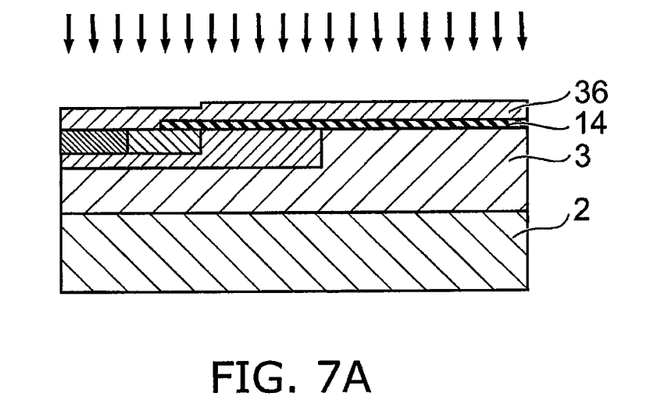

Next, as shown in FIG. 7A, arsenic (As) as N-type impurity is ion-implanted into the entire surface of the polysilicon layer 36. As the implantation condition, for instance, the dose amount can be set to $1 \times 10^{15}$ cm$^{-2}$, and the implantation energy can be set to 40 keV.

Next, a photoresist film is patterned by photolithography to form an implantation mask 42 on the surface of the polysilicon layer 36. In the implantation mask 42, an opening 42a is formed above the P-type contact region 13.

Figure 7B:
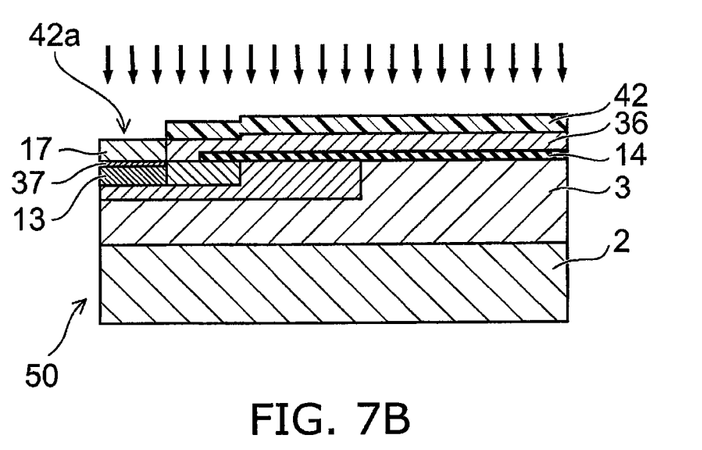

Subsequently, as shown in FIG. 7B, boron (B) as P-type impurity is ion-implanted at the room temperature. Here, the implantation amount and implantation energy of boron are set so as to turn the polysilicon layer 36 into a P-type conductive layer 17 and to form a damage region 37 in the portion of the P-type contact region 13 in contact with the polysilicon layer 36. For instance, the dose amount can be set to $3 \times 10^{15}$ cm$^{-2}$, and the implantation energy can be set to 150 keV.

Next, heat treatment is performed in a forming gas atmosphere at 900° C. for 10 minutes. Thus, the N-type impurity (As) and P-type impurity ion-implanted into the polysilicon layer 36 are activated. Furthermore, the damage region 37 formed in the surface portion of the P-type contact region 13 can be recrystallized to form a recrystallized region 5 including 3C—SiC.

Figure 8A:
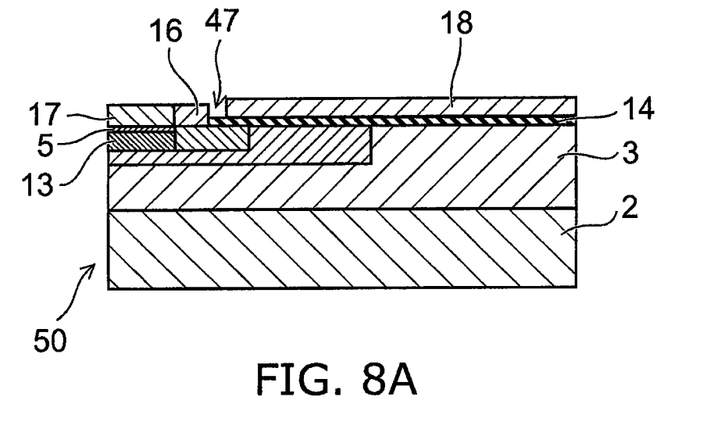

Next, as shown in FIG. 8A, the polysilicon layer 36 is patterned to form an isolation trench 47 at the end portion of the gate oxide film 14 on the contact window 45 side. Thus, the polysilicon layer 36 turned into an N-type conductive layer can be separated into a gate electrode 18 and an N-type conductive layer 16.

Figure 8B:
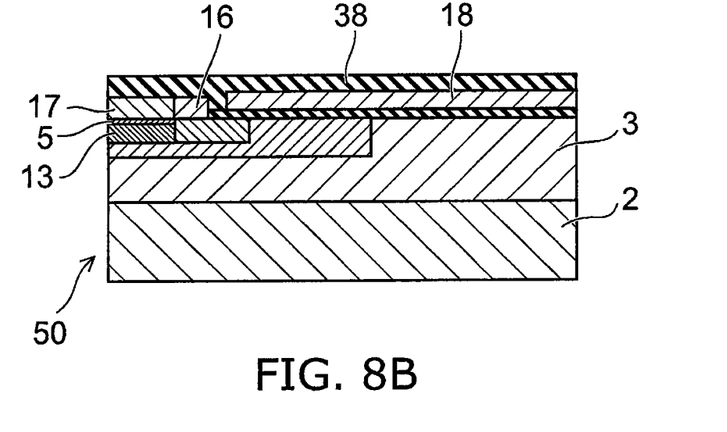

Next, as shown in FIG. 8B, an interlayer insulating film 38 is formed on the surface of the SiC wafer 50.

Figure 8C:
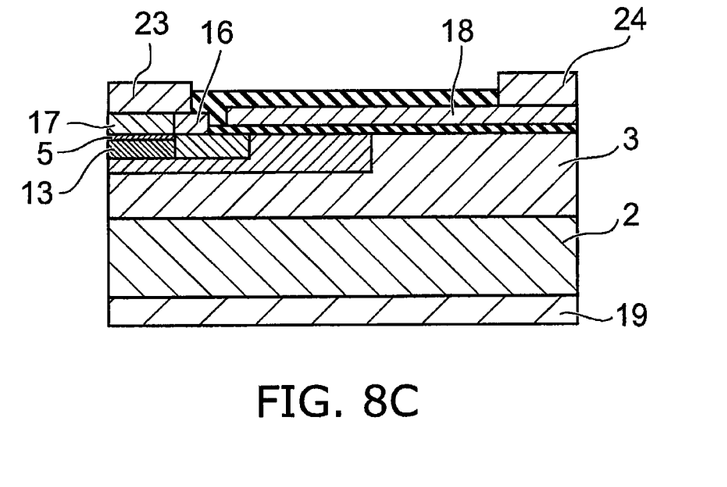

Furthermore, as shown in FIG. 8C, a contact window is opened in the interlayer insulating film 38. A source wiring 23 is formed in contact with the P-type conductive layer 17 and the N-type conductive layer 16. Furthermore, a gate wiring 24 is formed in contact with the gate electrode 18.

The source wiring 23 and the gate wiring 24 can be made of e.g. metal aluminum. By annealing in a forming gas atmosphere at 450° C. for 10 minutes, ohmic contact can be formed between the source wiring 23 and the P-type conductive layer 17, between the source wiring 23 and the N-type conductive layer, and between the gate wiring 24 and the gate electrode 18.

Furthermore, a drain electrode 19 is formed on the second major surface of the N-type SiC substrate 2. Thus, the power MOSFET 20 can be completed.

As described above, also in the method for manufacturing the power MOSFET 20 according to this embodiment, after forming a polysilicon layer 36 in contact with the P-type contact region 13 of the 4H—SiC structure, P-type impurity is ion-implanted to form a damage region 37. Furthermore, heat treatment is performed to form a recrystallized region 5 including 3C—SiC. Thus, a low resistance contact can be realized between the P-type conductive layer 16 and the P-type contact region 13.

Furthermore, in process after FIG. 6A for forming a gate oxide film 14 on the first major surface of the N-type SiC layer 3, the process can be performed at a temperature of 1000° C. or less as a treatment at the highest temperature being the heat treatment for recrystallizing the damage region 37 to form 3C—SiC. Thus, for instance, no degradation is caused at the interface of the gate oxide film 14 and the P-type base region 11. Hence, the variation of threshold voltage V$_{TH}$ and the occurrence of leakage current can be prevented. That is, the method for manufacturing a semiconductor device according to this embodiment can also be easily performed, and is suitable to manufacture the power MOSFET 20, for instance.

In the power MOSFET 20 according to this embodiment, the recrystallized region 5 is formed only in the surface portion of the P-type contact region 13. However, it is also possible to use a structure in which the recrystallized region 5 is formed also in the surface of the N-type source region 12.

For instance, the polysilicon layer 36 formed in FIG. 6C is formed as a conductive polysilicon layer doped with N-type impurity. Furthermore, the ion implantation of N-type impurity shown in FIG. 7A can be selectively performed to form a damage layer in the surface of the N-type source region 12. Thus, the recrystallized region 5 can be formed also in the surface of the N-type source region 12.

(Third Embodiment)

Figure 9:
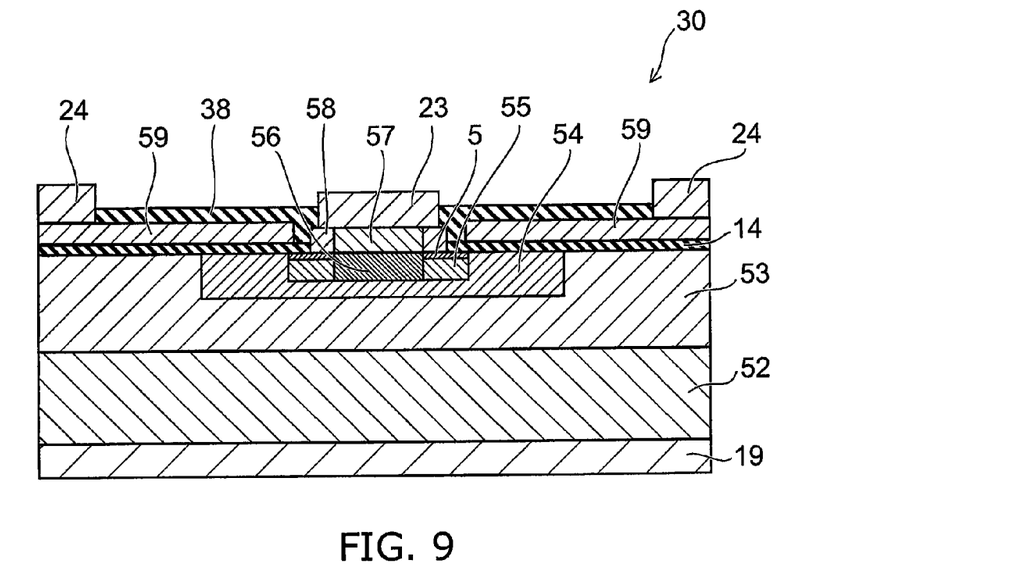
FIG. 9 is a schematic view showing a cross section of a semiconductor device according to a third embodiment.

FIG. 9 is a schematic view showing a cross section of a semiconductor device according to a third embodiment. The power MOSFET 30 according to this embodiment is different from the power MOSFET 20 according to the second embodiment in having a PMOS structure formed in a P-type SiC layer 53. In the description of this embodiment, it is assumed that the first conductivity type is P-type and the second conductivity type is N-type.

As shown in FIG. 9, the power MOSFET 30 includes a P-type SiC layer 53 having a hexagonal crystal structure, an N-type base region 54 as a first semiconductor region, a P-type source region 55 as a second semiconductor region, and an N-type contact region 56 as a third semiconductor region. The N-type base region 54 is provided in the first major surface, i.e., the surface of the P-type SiC layer 53. The P-type source region 55 is selectively provided in the surface of the N-type base region 54. The N-type contact region 56 is selectively provided in the surface of the N-type base region adjacent to the P-type source region 55.

A P-type conductive layer 58 as a first conductive layer and an N-type conductive layer 57 as a second conductive layer are provided on the P-type source region 55 and the N-type contact region 56, respectively. A recrystallized region 5 including 3C—SiC is formed in the portion of the P-type source region 55 in contact with the P-type conductive layer 58.

In the power MOSFET 30 according to this embodiment, 3C—SiC included in the recrystallized region 5 is in contact with the P-type conductive layer 58. Thus, also in the power MOSFET 30 according to this embodiment, the contact resistance between the P-type source region 55 and the P-type conductive layer 58 can be reduced. Furthermore, the recrystallized region 5 can also be formed in the surface of the N-type contact region 56.

(Fourth Embodiment)

Figure 10:
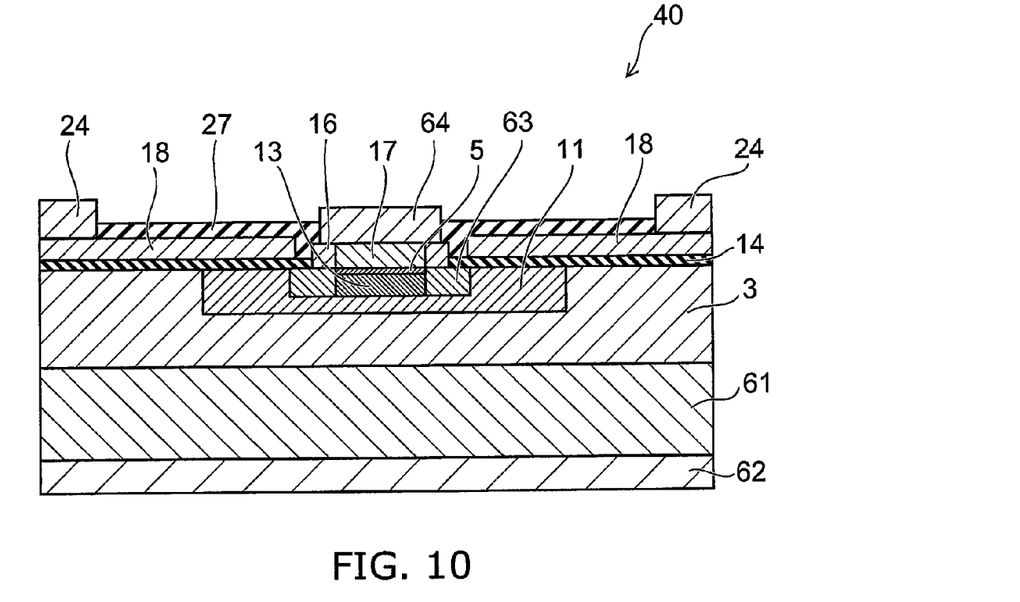
FIG. 10 is a schematic view showing a cross section of a semiconductor device according to a fourth embodiment.

FIG. 10 is a schematic view showing a cross section of a semiconductor device according to a fourth embodiment. The semiconductor device according to this embodiment is an IGBT 40 (insulated gate bipolar transistor) made of SiC.

As shown in FIG. 10, the IGBT 40 includes an N-type SiC layer 3 having a hexagonal crystal structure, a P-type base region 11, an N-type emitter region 63, and a P-type contact region 13. The N-type SiC layer 3 is formed on the first major surface of a P-type SiC substrate 61 made of 4H—SiC. The P-type base region 11 is provided in the first major surface, i.e., the surface of the N-type SiC layer 3. The N-type emitter region 63 is selectively provided in the surface of the P-type base region 11. The P-type contact region 13 is selectively provided in the surface of the P-type base region 11 adjacent to the N-type emitter region 63.

A gate electrode 18 is provided above the P-type base region 11 via a gate oxide film 14. A collector electrode 62 is provided on the second major surface of the P-type SiC substrate 61.

On the other hand, an N-type conductive layer 16 and a P-type conductive layer 17 are provided on the surface of the N-type emitter region 63 and on the P-type contact region 13, respectively. Furthermore, an emitter wiring 64 is provided on the N-type conductive layer 16 and the P-type conductive layer 17. A recrystallized region 5 including 3C—SiC is formed in the surface portion of the P-type contact region 13 in contact with the P-type conductive layer 17.

Also in the structure of the IGBT 40 according to this embodiment, the contact resistance between the conductive layer and the N-type emitter region 63 made of 4H—SiC and between the conductive layer and the P-type contact region 13 made of 4H—SiC is reduced by forming an N-type conductive layer 16 and a P-type conductive layer 17 in contact with the N-type emitter region 63 and the P-type contact region 13, respectively. Furthermore, the IGBT 40 is configured so that a recrystallized region 5 is formed in the surface portion of the P-type contact region 13. Thus, the recrystallized region 5 including 3C—SiC is brought into contact with the P-type conductive layer 17 to reduce the contact resistance.

The invention has been described above with reference to the first to fourth embodiments according to the invention. However, the invention is not limited to these embodiments. For instance, within the spirit of the invention, those skilled in the art may be able to conceive various modifications such as changes in design and material based on the technology level at the time of filing this application. Such modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
   a SiC layer of a first conductivity type having a hexagonal crystal structure;
   a first SiC region of a second conductivity type selectively provided in the SiC layer, the first SiC region having a hexagonal crystal structure;
   a second SiC region of the second conductivity type selectively provided in the first SiC region, the second SiC region having a cubic crystal structure; and
   a conductive layer of the second conductivity type provided on the second SiC region, and being in contact with the second SiC region, wherein
   the first and second conductivity types are opposite conductivity types.

2. The device according to claim 1, wherein the conductive layer comprises polysilicon.

3. The device according to claim 1, wherein the conductive layer is in contact with both the SiC layer and the first SiC region.

4. The device according to claim 3, wherein a contact resistance between the conductive layer and the second SiC region is lower than a contact resistance between the conductive layer and the first SiC region.

5. The device according to claim 1, wherein the first SiC region includes aluminum as an impurity.

6. The device according to claim 5, wherein the second SiC region includes aluminum and boron as an impurity.

7. The device according to claim 1, further comprising:
   an electrode electrically connected to the conductive layer.

* * * * *